(12) United States Patent
Buonodono et al.

(10) Patent No.: US 7,812,325 B2
(45) Date of Patent: Oct. 12, 2010

(54) IMPLANTING WITH IMPROVED UNIFORMITY AND ANGLE CONTROL ON TILTED WAFERS

(75) Inventors: James Buonodono, Amesbury, MA (US); Paul Murphy, Reading, MA (US); Joseph C. Olson, Beverly, MA (US); Anthony Renau, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 408 days.

(21) Appl. No.: 11/536,046

(22) Filed: Sep. 28, 2006

(65) Prior Publication Data

US 2008/0078950 A1 Apr. 3, 2008

(51) Int. Cl.
*H01J 37/08* (2006.01)
*A61N 5/00* (2006.01)

(52) U.S. Cl. .............................. 250/492.21; 250/492.2; 250/396 R; 250/492.3

(58) Field of Classification Search ............ 250/492.21, 250/492.2
See application file for complete search history.

(56) References Cited

U.S. PATENT DOCUMENTS

| 6,437,350 | B1 * | 8/2002 | Olson et al. | 250/492.21 |
|---|---|---|---|---|
| 6,903,348 | B2 * | 6/2005 | Jang et al. | 250/492.21 |
| 6,992,309 | B1 * | 1/2006 | Petry et al. | 250/492.21 |
| 2005/0251279 | A1 * | 11/2005 | Ray | 700/114 |
| 2006/0145095 | A1 * | 7/2006 | Olson et al. | 250/492.21 |
| 2008/0096359 | A1 * | 4/2008 | Gupta et al. | 438/302 |

* cited by examiner

*Primary Examiner*—Robert Kim
*Assistant Examiner*—Johnnie L Smith

(57) ABSTRACT

A system, method and program product for improving uniformity and angle control wafers being implanted. A system is provided that includes an end station for positioning a wafer being implanted, comprising: a platen for holding the wafer, wherein the platen is rotatable to provide wafer rotation; a housing for holding the platen, wherein the housing is rotatable about a first orthogonal axis to provide a first type of wafer tilt; a structure for supporting the housing, wherein the structure is rotatable about a second orthogonal axis to provide a second type of wafer tilt; and a control system which, during an implant process of the wafer, causes wafer rotation, the first type of wafer tilt, and the second type of wafer tilt.

11 Claims, 5 Drawing Sheets

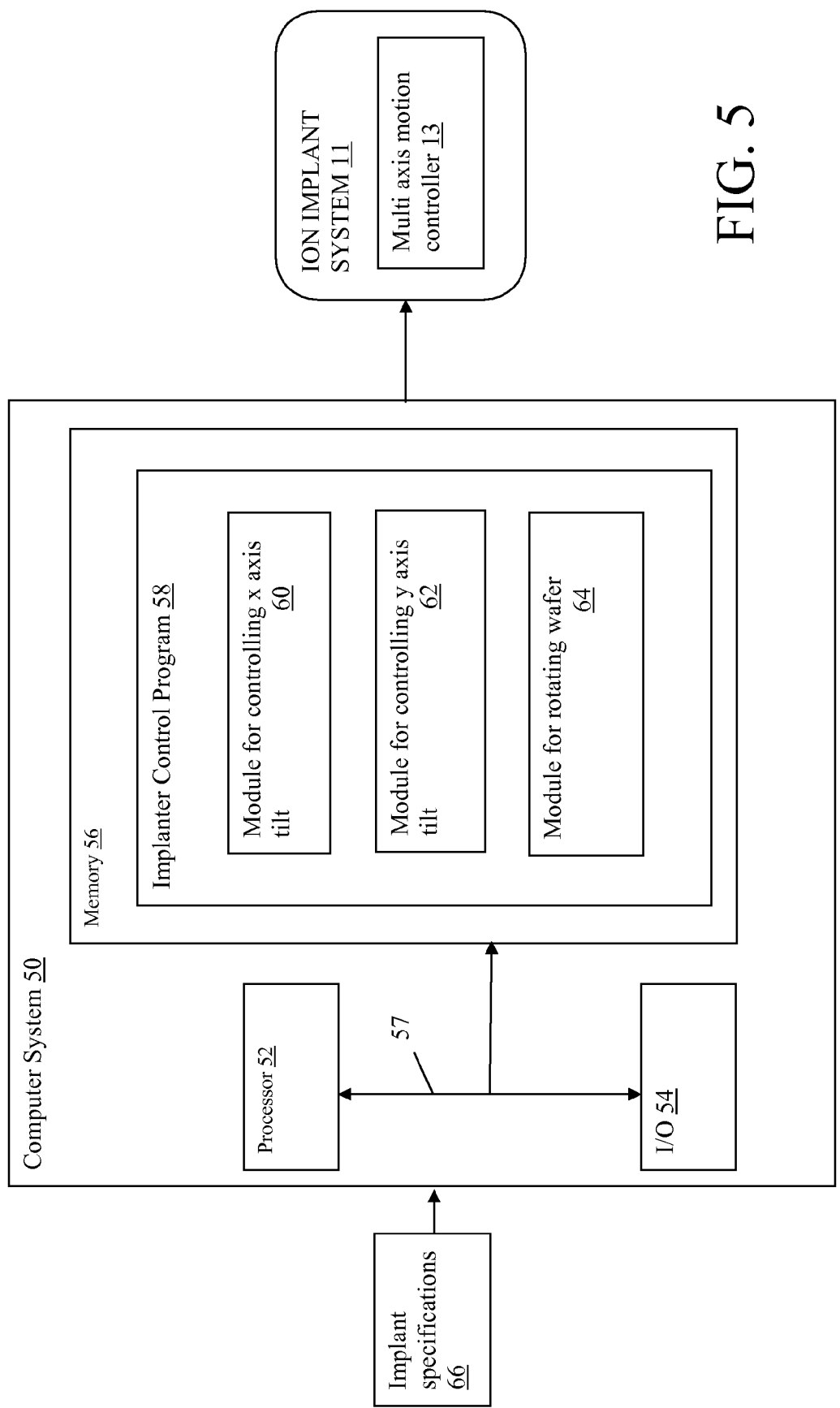

IMPLANTING WITH IMPROVED UNIFORMITY AND ANGLE CONTROL ON TILTED WAFERS

FIELD OF THE INVENTION

The invention relates generally to single wafer implantations, and more particularly to a system, method and program product for improving dose uniformity and angle uniformity of single wafer implants using discrete wafer rotations while maintaining wafer orientation.

BACKGROUND OF THE INVENTION

Fabricating a chip, which starts with a bare wafer of silicon, may involve hundreds of different processes. One of the most fundamental steps in the manufacturing process is impregnating flawless silicon with intentional abnormalities, around which the structure of the chip will eventually be built. This process is called ion implantation and is an incredibly complex mix of high-energy physics, molecular chemistry, and robotics. As the size of the channels on chips continues to get smaller, the art of implanting ions gets even more complicated.

The process of implanting ions involves delivering a beam across the wafer, often at different angles to achieve desired geometries. Providing a uniform beam angle across the wafer is critical for eliminating unwanted effects. Challenges arise however because different parts of the beam hit different parts of the wafer. Further difficulties arise because when a beam is directed at a wafer at a non-zero angle, the photo-resist material on the surface of the wafer will block, i.e., "shadow," the beam, so that only one wall within a trench is actually implanted. Accordingly, techniques are required that will both average out the effects of the beam and address shadowing.

A common approach for addressing these issues includes utilizing a conventional quad mode implant that will vary the wafer rotation. Quad mode involves repositioning the wafer four times by rotating it 90 degrees. By rotating the wafer to four different positions, four different walls within a trench can be separately implanted. However, since each step of the quad mode is actually doping a different part of the wafer, the rotation does not accomplish any averaging (i.e., uniformity). Another approach is to tilt the wafer about a single axis to provide different beam angles for implanting different walls. Similarly, this approach fails to provide uniformity. Accordingly, a need exists for an improved system and method of implanting ions that will reduce the effect of beam imperfections.

SUMMARY OF THE INVENTION

A system, method and program product for improving dose uniformity and angle uniformity of single wafer implants using discrete wafer rotations while maintaining wafer orientation are disclosed. The system, method and program product allow for the adjustment of tilt in conjunction with the wafer rotation. The rotation of the wafer allows non-uniformities in beam current or beam angle to be averaged out over more of the wafer, resulting in improved uniformity. The adjustment of the tilt angles maintains wafer orientation.

In a first aspect is provided a method for implanting a wafer, comprising: providing an apparatus for holding a wafer, wherein the apparatus can rotate the wafer and tilt the wafer about a first and a second orthogonal axis; tilting the wafer to a first angle about the first orthogonal axis; implanting the wafer at a plurality of different rotational positions; tilting the wafer to a second angle about the first orthogonal axis; implanting the wafer at the plurality of different rotational positions; tilting the wafer to a third angle about the second orthogonal axis; implanting the wafer at the plurality of different rotational positions; tilting the wafer to a fourth angle about the second orthogonal axis; and implanting the wafer at the plurality of different rotational positions.

In a second aspect is provided an ion implant system having an end station for positioning a wafer being implanted, comprising: a platen for holding the wafer, wherein the platen is rotatable to provide wafer rotation; a housing for holding the platen, wherein the housing is rotatable about a first orthogonal axis to provide a first type of wafer tilt; a structure for supporting the housing, wherein the structure is rotatable about a second orthogonal axis to provide a second type of wafer tilt; and a control system which, during an implant process of the wafer, causes wafer rotation, the first type of wafer tilt, and the second type of wafer tilt.

In a third aspect is provided a computer program product stored on a computer readable medium for controlling a position of a wafer at an end station during an implantation process, comprising: program code configured for rotating the wafer to predetermined angular positions; program code configured for rotating the wafer about a first orthogonal axis to provide a first type of wafer tilt; and program code configured for rotating the wafer about a second orthogonal axis to provide a second type of wafer tilt.

BRIEF DESCRIPTION OF THE DRAWINGS

These and other features of this invention will be more readily understood from the following detailed description of the various aspects of the invention taken in conjunction with the accompanying drawings in which:

FIG. 5 depicts a computer system having an implant control program for controlling the end station of FIGS. 2, 3A and 3B in accordance with an embodiment of the present invention.

Note that the figures are not necessarily drawn to scale, but instead are provided to illustrate features further described herein.

DETAILED DESCRIPTION OF THE INVENTION

Described herein is a single wafer ion implantation system having an end station capable of tilting the wafer about two orthogonal axes and rotating the wafer about a third axis. In an implant done in accordance with an illustrative embodiment, the wafer undergoes 90 degree rotations, and after each rotation the wafer tilt is adjusted to maintain its original orientation. All angles stated herein are approximations.

Figure 1:
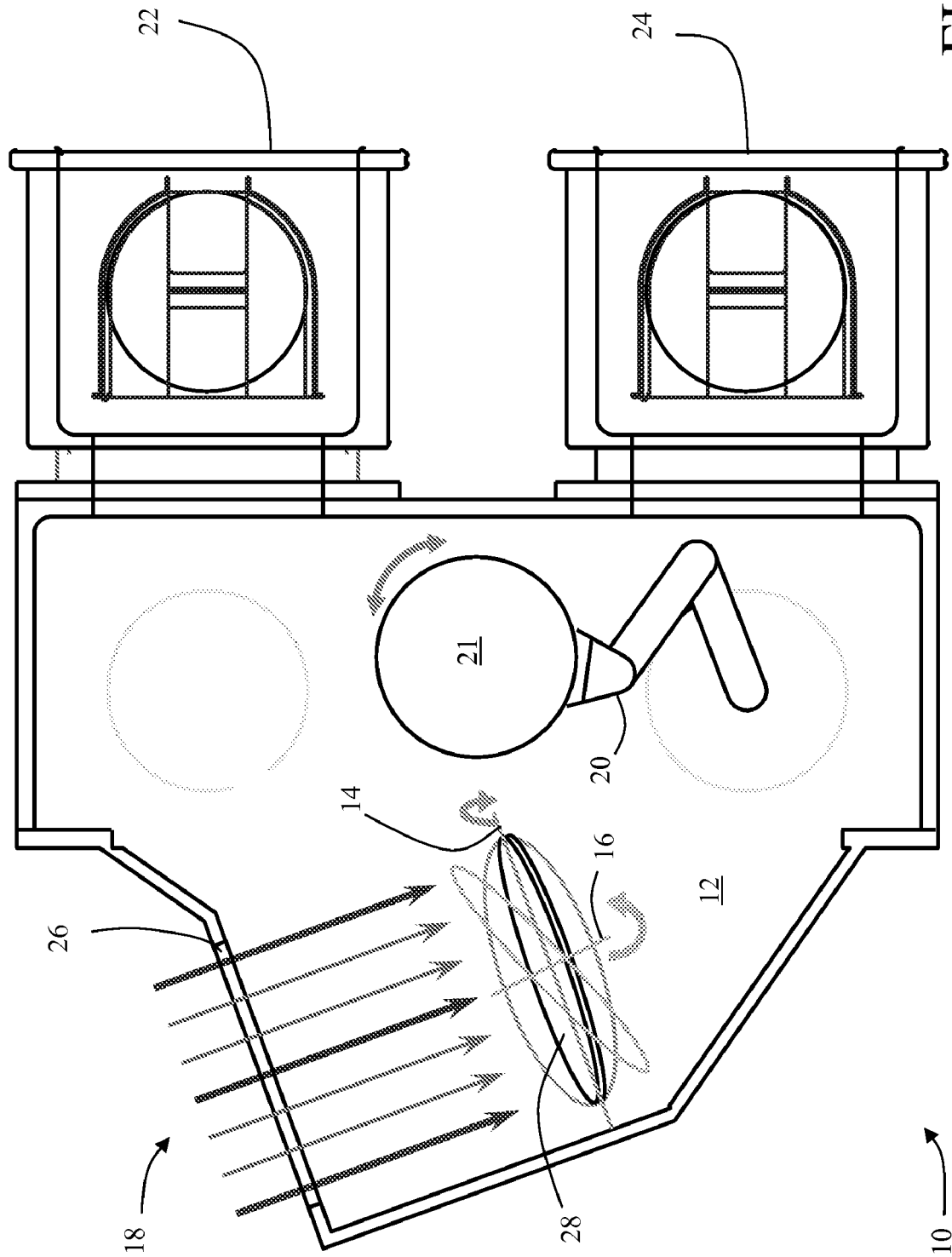
FIG. 1 depicts wafer ion implantation system in accordance with an embodiment of the present invention.

Referring now to the drawings, FIG. 1 depicts a schematic of an ion implantation end station 10 that includes a vacuum chamber 12 for processing a wafer 28, a pair of load locks 22, 24 for storing wafers, one or more robots 20 for transporting wafers, an aligner 21 for aligning wafers, and an opening in the chamber wall 26 for receiving ion beams 18 from an ion implanter beamline (not shown). Within vacuum chamber 12 is an apparatus comprising a multi axis vacuum robot (referred to herein as a "roplat") that includes an electrostatic wafer clamp (i.e., "platen") (not shown in FIG. 1) capable of tilting wafer 28 about an X-axis 14 and a Y-axis 16, as well as rotating the wafer 28. Details of the roplat and platen are provided below with regard to FIGS. 2, 3A and 3B.

Figure 2:
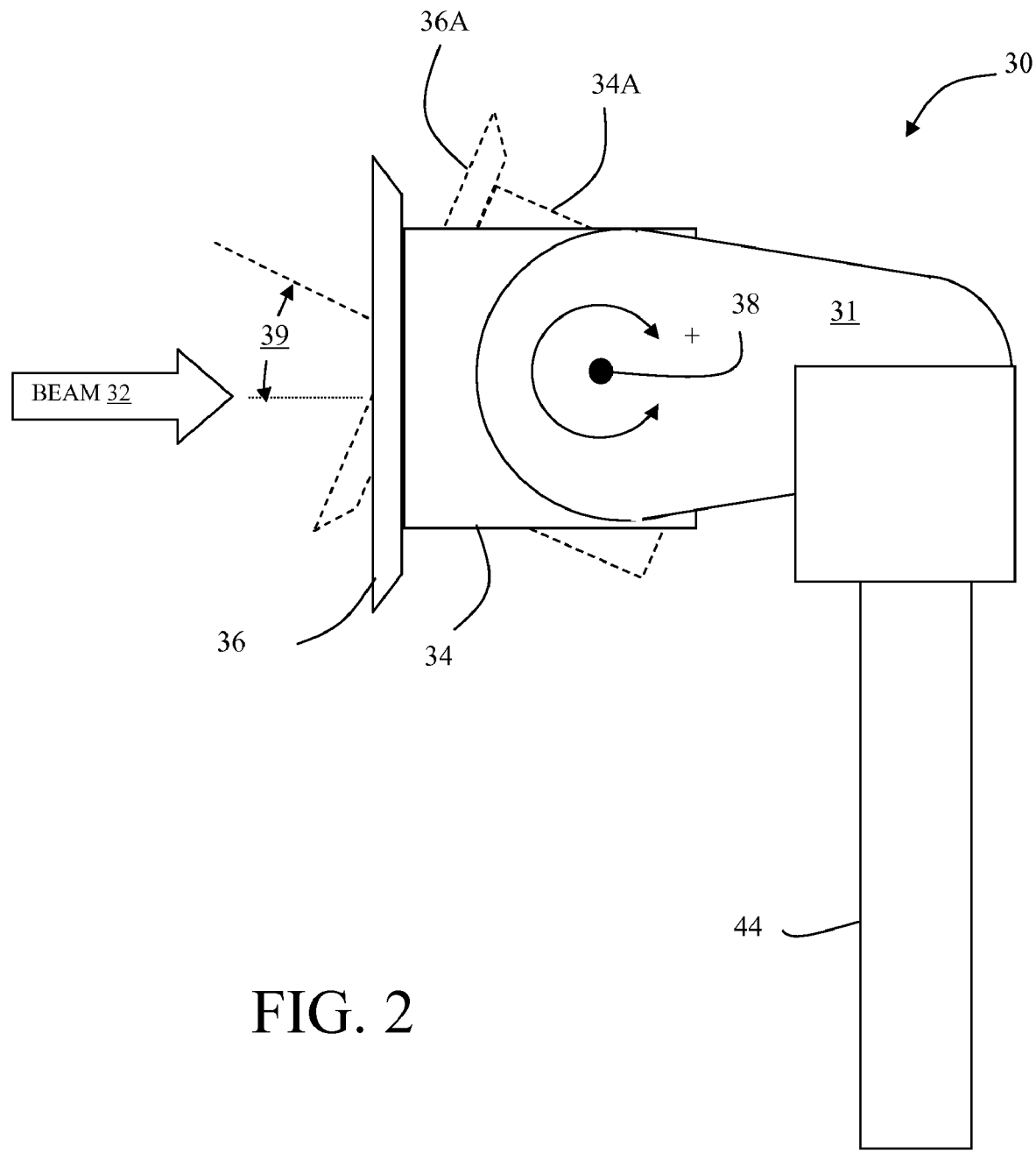
FIG. 2 depicts a side view of an end station in accordance with an embodiment of the present invention.

FIG. 2 depicts a side view of the roplat 30 showing upward and downward, i.e., X-axis, tilt. Roplat 30 includes a rotatable wafer housing 34 onto which platen 36 is affixed for holding a wafer. As shown, wafer housing 34 is set to 0 degrees of tilt. In the 0 degree setting, ion beam 32 is transmitted normal to the surface of the wafer. To provide X-axis tilt, wafer housing 34 can be rotated, i.e., tilted, relative to a support structure 31 in a positive or negative direction about X-axis 38. An example of a positive X-axis tilt is achieved by tilting housing 34 (and platen 36) upward. The resulting position is shown in dotted lines as housing 34A and platen 36A. As can be seen, in this setting, ion beam 32 would be transmitted with a positive offset angle 39 relative to the surface of the wafer. Although not shown, a negative offset angle can likewise be achieved by tilting housing 34 in a downward direction. To provide a full range of capabilities, roplat 30 may allow for up to +/−70 degrees of tilt about the X-axis 38 during implant operations.

Figure 3A:
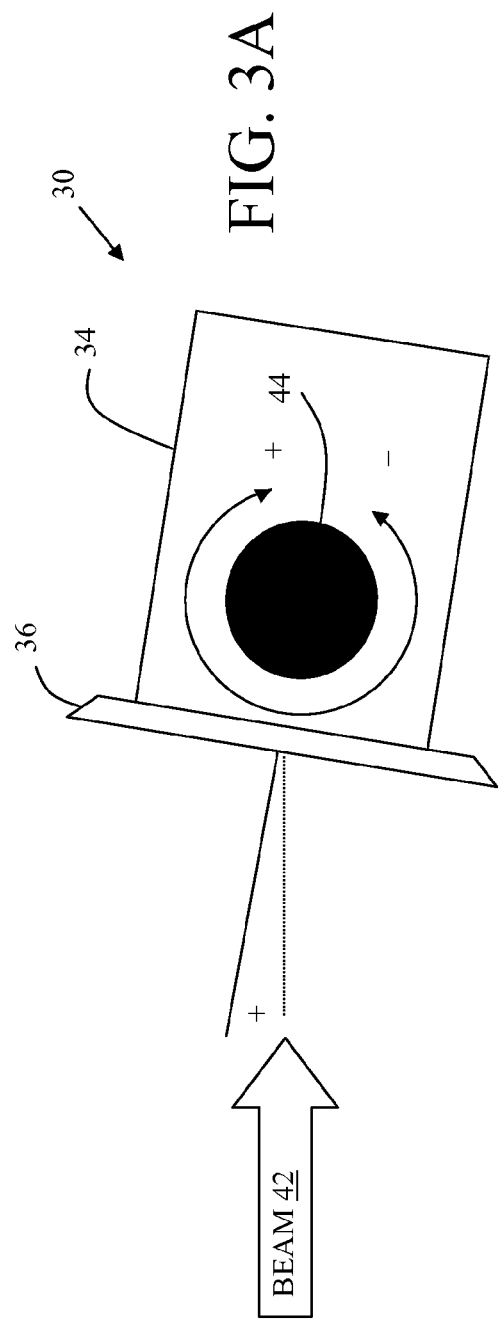
FIGS. 3A and 3B depict a top view of an end station in accordance with an embodiment of the present invention.
Figure 3B:
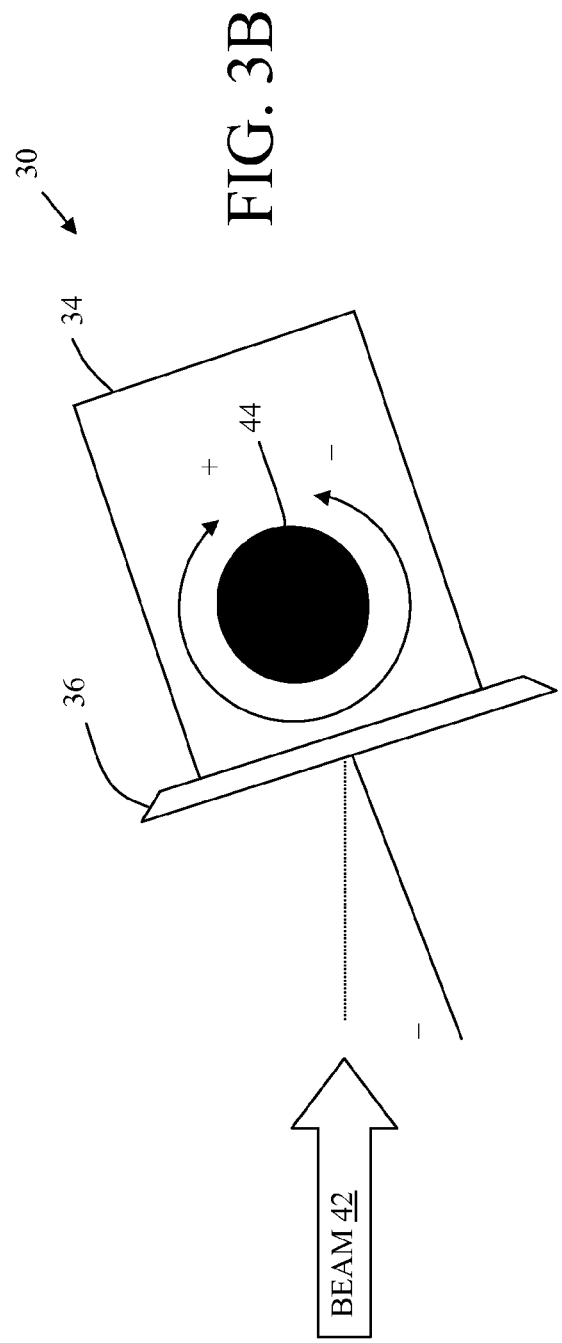

FIGS. 3A and 3B depict a top view of roplat 30 showing side-to-side, i.e., Y-axis, tilt. In this illustrative embodiment, Y-axis tilt is achieved by rotating roplat 30 about a shaft 44, which defines the Y-axis. Thus, as can be seen, a positive (FIG. 3A) or negative (FIG. 3B) Y-axis tilt can be achieved relative to ion beam 42. Roplat 30 also may allow for up to +/−75 degrees of tilt about the Y-axis to provide a full range of implant capabilities.

Figure 4:
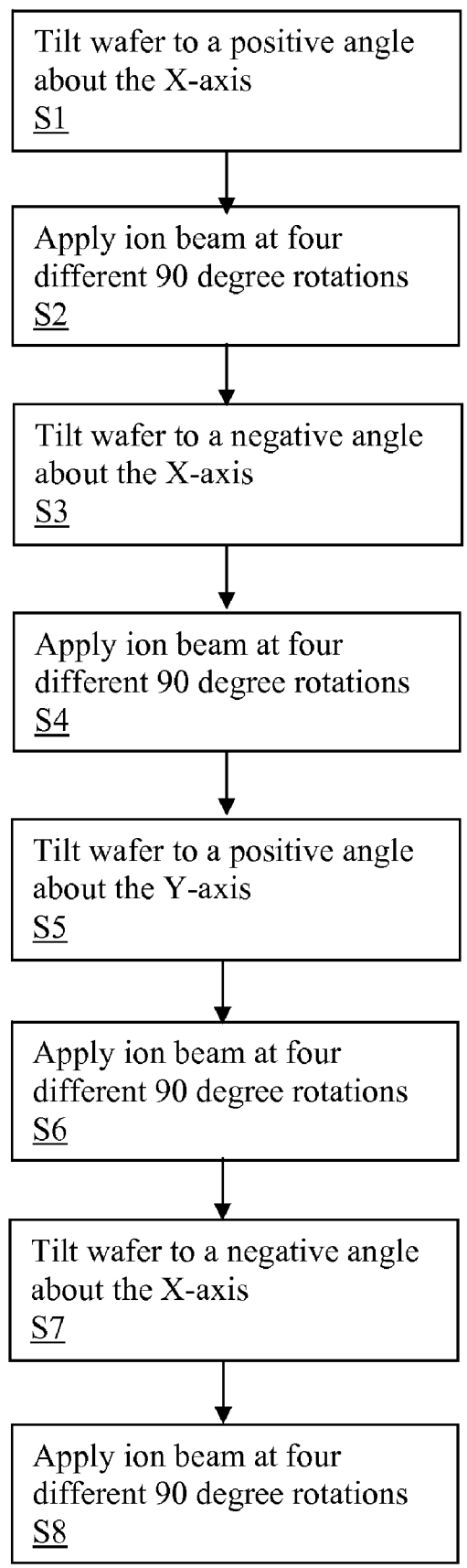
FIG. 4 depicts a flow diagram of an implantation method in accordance with an embodiment of the present invention.

A quad mode operation of the roplat 30 for implanting a wafer is shown in further detail in the flow diagram of FIG. 4. At step S1, the wafer is tilted to a positive angle relative to normal about the X-axis. At step S2, the wafer is implanted at four different 90 degree rotations, i.e., the beam is applied (I); the wafer is rotated 90 degrees and the beam is applied (II); the wafer is rotated 90 degrees and the beam is applied (III); and the wafer is rotated 90 degrees and the beam is applied (IV). At step S3, the wafer is tilted to a negative angle relative to normal about the X-axis. At step S4, the wafer is implanted at four different 90 degree rotations, as done in step S2. At step S5, the wafer is tilted to a positive angle relative to normal about the Y-axis. At step S6, the wafer is implanted at four different 90 degree rotations, as done in steps S2 and S4. At step S7, the wafer is tilted to a negative angle relative to normal about the Y-axis. At step S8, the wafer is implanted at four different 90 degree rotations, as done in steps S2, S4 and S6. In accordance with this quad mode operation, 16 different implants are done on the wafer.

Obviously, the order in which tilts and rotations occur could vary without departing from the scope of the invention. Furthermore, in a case where only two trench walls are required (i.e., dual mode), steps S2, S4, S6 and S8 would be modified to implant the wafer at just two 180 degree rotations. Otherwise the process is the same. Typical tilt angles are on the order of 20-60 degrees. However, some applications could potentially warrant tilt angles of as high as 70 degrees. Moreover, it is understood that X and Y axes are used herein to generally describe two possible orthogonal axes that can be utilized to implement the invention. However, it is understood that the invention is not limited to specific axes or a specific axis naming convention.

FIG. 5 depicts a control system comprised of (1) a computer system 50 having an implanter control program 58, and (2) a multi axis motion controller 13. Implanter control program 58 instructs multi axis motion controller 13 to perform the tilting and rotation operations described above within ion implantation system 11 based on an inputted set of implant specifications 66. As can be seen, implanter control program 58, which may be implanted as a program product or software, includes a first module 60 for controlling the X-axis tilt, a second module 62 for controlling the Y-axis tilt, and a third module 64 for controlling the wafer rotation. Implanter control program 58, when executed by computer system 50, communicates with ion implantation system 11 and instructs multi axis motion controller 13 to move roplat 30 and platen 36 (FIGS. 2, 3A and 3B) according to a predetermined scheme, such as that described above.

In general, computer system 50 may comprise any type of computer and generally includes a processor 52, input/output (I/O) 54, memory 56, and bus 57. The processor 52 may comprise a single processing unit, or be distributed across one or more processing units in one or more locations, e.g., on a client and server. Memory 56 may comprise any known type of data storage and/or transmission media, including magnetic media, optical media, random access memory (RAM), read-only memory (ROM), a data cache, a data object, etc. Moreover, memory 56 may reside at a single physical location, comprising one or more types of data storage, or be distributed across a plurality of physical systems in various forms.

I/O 54 may comprise any system for exchanging information to/from an external resource. External devices/resources may comprise any known type of external device, including a monitor/display, speakers, storage, another computer system, a hand-held device, keyboard, mouse, voice recognition system, speech output system, printer, facsimile, pager, etc. Bus 57 provides a communication link between each of the components in the computer system 50 and likewise may comprise any known type of transmission link, including electrical, optical, wireless, etc. Although not shown, additional components, such as cache memory, communication systems, system software, etc., may be incorporated into computer system 50.

Access to computer system 50 may be provided over a network such as the Internet, a local area network (LAN), a wide area network (WAN), a virtual private network (VPN), etc. Communication could occur via a direct hardwired connection (e.g., serial port), or via an addressable connection that may utilize any combination of wireline and/or wireless transmission methods. Moreover, conventional network connectivity, such as Token Ring, Ethernet, WiFi or other conventional communications standards could be used. Still yet, connectivity could be provided by conventional TCP/IP sockets-based protocol. In this instance, an Internet service provider could be used to establish interconnectivity. Further, as indicated above, communication could occur in a client-server or server-server environment.

It is understood that the systems, functions, mechanisms, methods, engines and modules described herein can be implemented in hardware, software, or a combination of hardware and software. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. In a further embodiment, part or all of the invention could be implemented in a distributed manner, e.g., over a network such as the Internet.

The present invention can also be embedded in a computer program product, which comprises all the features enabling the implementation of the methods and functions described herein, and which—when loaded in a computer system—is able to carry out these methods and functions. Terms such as computer program, software program, program, program product, software, etc., in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

The invention claimed is:

1. A method for implanting a wafer, comprising:
   providing an apparatus for holding a wafer, wherein the apparatus can rotate the wafer and tilt the wafer about a first orthogonal axis and a second orthogonal axis;
   tilting the wafer to a first angle about the first orthogonal axis;
   implanting the wafer at a plurality of different rotational positions;
   tilting the wafer to a second angle about the first orthogonal axis;
   implanting the wafer at the plurality of different rotational positions;
   tilting the wafer to a third angle about the second orthogonal axis;
   implanting the wafer at the plurality of different rotational positions;
   tilting the wafer to a fourth angle about the second orthogonal axis;
   implanting the wafer at the plurality of different rotational positions; and
   wherein the tilting to the first angle, the second angle, the third angle, and the fourth angle and the implanting at the plurality of different rotational positions are configured to uniformly implant the wafer and wherein the second angle is a negative of the first angle and the fourth angle is a negative of the third angle.

2. The method of claim 1, wherein the first orthogonal axis comprises an X-axis, and the second orthogonal axis comprises a Y-axis.

3. The method of claim 1, wherein each of the implanting steps includes:
   implanting the wafer at a first position;
   rotating the wafer 90 degrees to a second position;
   implanting the wafer at the second position;
   rotating the wafer 90 degrees to a third position;
   implanting the wafer at the third position;
   rotating the wafer 90 degrees to a fourth position; and
   implanting the wafer at the fourth position.

4. The method of claim 1, wherein each of the implanting steps includes:
   implanting the wafer at a first position;
   rotating the wafer 180 degrees to a second position; and
   implanting the wafer at the second position.

5. The method of claim 1, wherein each of tilting steps comprises tilting the wafer to an angle up to 70 degrees.

6. A computer program product stored on a computer readable medium for controlling a position of a wafer at an end station during an implantation process, comprising:
   program code configured for rotating the wafer to predetermined rotational positions;
   program code configured for rotating the wafer about a first orthogonal axis to provide a first type of wafer tilt;
   program code configured for rotating the wafer about a second orthogonal axis to provide a second type of wafer tilt; and
   program code for causing an ion beam to implant the wafer at a plurality of different rotational positions for each of four different tilt positions about the first orthogonal axis and the second orthogonal axis, wherein effects of the ion beam are averaged across the wafer due to the plurality of different rotational positions for each of the four different tilt positions.

7. The computer program product of claim 6, wherein the first orthogonal axis comprises an X-axis and provides upward and downward tilting of the wafer.

8. The computer program product of claim 7, wherein the second orthogonal axis comprises a Y-axis and provides side to side tilting of the wafer.

9. The computer program product of claim 8, wherein the program code configured for rotating the wafer about the Y-axis provides between +/−30 and +/−70 degrees of rotation about the Y-axis.

10. The computer program product of claim 6, wherein:
    the program code configured for rotating the wafer about the first orthogonal axis causes the wafer to be tilted to a first and a second position;
    the program code configured for rotating the wafer about the second orthogonal axis causes the wafer to be tilted to a third and fourth position; and
    for each of the first, second, third and fourth positions, the wafer is rotated to four different rotational positions for implantation.

11. The computer program product of claim 6, wherein:
    the program code configured for rotating the wafer about the first orthogonal axis causes the wafer to be tilted to a first and a second position;
    the program code configured for rotating the wafer about the second orthogonal axis causes the wafer to be tilted to a third and fourth position; and
    for each of the first, second, third and fourth positions, the wafer is rotated to two different rotational positions for implantation.

* * * * *